(12) United States Patent
Matsuda et al.

(10) Patent No.: US 8,664,835 B2
(45) Date of Patent: Mar. 4, 2014

(54) ACOUSTIC WAVE DEVICE

(71) Applicant: Taiyo Yuden Co., Ltd., Tokyo (JP)

(72) Inventors: Satoru Matsuda, Tokyo (JP); Takashi Matsuda, Tokyo (JP); Michio Miura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/712,218

(22) Filed: Dec. 12, 2012

(65) Prior Publication Data

US 2013/0099630 A1 Apr. 25, 2013

Related U.S. Application Data

(63) Continuation of application No. PCT/JP2011/060316, filed on Apr. 27, 2011.

(30) Foreign Application Priority Data

Aug. 31, 2010 (JP) .................................. 2010-195020

(51) Int. Cl.
*H03H 9/02* (2006.01)
(52) U.S. Cl.
CPC ....... *H03H 9/02102* (2013.01); *H03H 9/02834* (2013.01)
USPC .................. 310/341; 310/313 R; 310/321
(58) Field of Classification Search
CPC .......... H03H 9/02102; H03H 9/02834; H03H 9/131; H03H 9/174; H01L 41/047
USPC ........................................................ 310/341
See application file for complete search history.

(56) References Cited

U.S. PATENT DOCUMENTS

2007/0120625 A1 5/2007 Larson, III et al.

FOREIGN PATENT DOCUMENTS

| JP | 56-056025 A | 5/1981 |
| JP | 61-218215 A | 9/1986 |
| JP | 2007-159123 A | 6/2007 |
| JP | 2010-050726 A | 3/2010 |
| JP | 2010-087578 A | 4/2010 |

OTHER PUBLICATIONS

English translation of Written Opinion (PCT/ISA/237) issued in PCT/JP2011/060316 published in Mar. 2013.
International Search Report (ISR) issued in PCT/JP2011/060316 mailed in Jun. 2011.
Written Opinion (PCT/ISA/237) issued in PCT/JP2011/060316 mailed in Jun. 2011.
Lakin et al., "Temperature Coefficient and Ageing of BAW Composite Materials", TFR Technologies, Inc.
Lin et al., "Thermally compensated aluminum nitride Lamb wave resonators for high temperature applications", Applied Physics Letters 97, (2010).
Horng et al., "Refractive index behavior of boron-doped silica films by plasma-enhanced chemical vapor deposition", Applied Surface Science, 92, pp. 387-390 (1996).
Wei et al., "Ultrasonic Characterization of Silicate Glasses", IEICE technical report, US 98-50 (Sep. 1998).

(Continued)

*Primary Examiner* — Derek Rosenau
(74) *Attorney, Agent, or Firm* — Chen Yoshimura LLP

(57) ABSTRACT

An acoustic wave device includes: an electrode that excites an acoustic wave and is located on a substrate; and a silicon oxide film that is located so as to cover the electrode and is doped with an element or molecule displacing O in a Si—O bond, wherein the element or molecule is F, H, $CH_3$, $CH_2$, Cl, C, N, P, or S.

13 Claims, 12 Drawing Sheets

(56) References Cited

OTHER PUBLICATIONS

Kim et al., "Characterization of low-dielectric-constant SiOC thin films deposited by PECVD for interlayer dielectrics of multilevel interconnection", Surface and Coatings Technology, 171, pp. 39-45 (2003).

Lee et al., "Effect of fluorine on dielectric properties of SiOF films", J. Appl. Phys., Nov. 1, 1996, vol . 80, No. 9, pp. 5260-5263.

Lucovsky et al., "Low-temperature growth of silicon dioxide films: A study of chemical bonding by ellipsometry and infrared spectroscopy", J. Vac. Sci. Technol. B, Mar./Apr. 1987, vol. 5, Issue 2, pp. 530-537.

Parker et al., "Temperature-compensated surface-acoustic-wave devices with SiO2 film overlays", J. Appl. Phys., Mar. 1979, vol. 50, No. 3, pp. 1360-1369.

Japanese Office Action dated Dec. 17, 2013, in a counterpart Japanese patent application No. 2012-531711.

ACOUSTIC WAVE DEVICE

CROSS-REFERENCE TO RELATED APPLICATION

This application is a continuation application of PCT/JP2011/060316 filed Apr. 27, 2011, the contents of which are herein wholly incorporated by reference.

FIELD

A certain aspect of the present invention relates to an acoustic wave device.

BACKGROUND

There has been known a surface acoustic wave device, which includes a comb-shaped electrode formed of IDTs (Interdigital Transducer) formed on a surface of a piezoelectric substrate, an FBAR (Film Bulk Acoustic Resonator) device, in which a lower electrode, a piezoelectric film, and an upper electrode are stacked on a substrate, and a Lamb wave device, in which a lower electrode, a piezoelectric film, and an upper comb-shaped electrode are stacked, as acoustic wave devices using acoustic waves. These acoustic wave devices are small and light, can obtain high attenuation, and thus are used as filters of wireless devices such as mobile phone terminals.

Recent advancements in high performance of mobile phone terminals require acoustic wave devices to improve temperature characteristics and to reduce the absolute value of a temperature coefficient of frequency (TCF) such as the passband of a filter or the resonance frequency of a resonator. For example, there has been known that the absolute value of the TCF can be made small in the surface acoustic wave device by forming a silicon oxide film having a temperature coefficient opposite in sign to that of the piezoelectric substrate such as $LiTaO_3$(LT) or $LiNbO_3$(LN) on the piezoelectric substrate. There has been known that the TCF can also be made small in the FBAR device by providing a silicon oxide film in a region in which the lower electrode and the upper electrode face each other as disclosed in K. M Lakin and three others, "Temperature Coefficient and Ageing of BAW Composite Materials", TFR Technologies, Inc. In addition, there has been known that the TCF can also be made small in the Lamb wave device by providing a silicon oxide film below the lower electrode as disclosed in Chin-Ming Lin and five others, "Thermally compensated aluminum nitride Lamb wave resonators for high temperature applications", APPLIED PHYSICS LETTERS 97, 083501 (2010).

Moreover, there has been known using a silicon oxide film doped with B (boron) as a temperature compensation layer in the FBAR device as disclosed in Japanese Patent Application Publication No. 2007-159123 (Patent Document 1).

Patent Document 1 uses the silicon oxide film doped with B as the temperature compensation layer, but has a problem that even the use of the silicon oxide film doped with B fails to improve a temperature dependence of frequency sufficiently.

SUMMARY OF THE INVENTION

According to an aspect of the present invention, there is provided an acoustic wave device including: an electrode that excites an acoustic wave and is located on a substrate; and a silicon oxide film that is located so as to cover the electrode and is doped with an element or molecule displacing O in a Si—O bond, wherein the element or molecule is F, H, $CH_3$, $CH_2$, Cl, C, N, P, or S.

DETAILED DESCRIPTION

Figure 1:
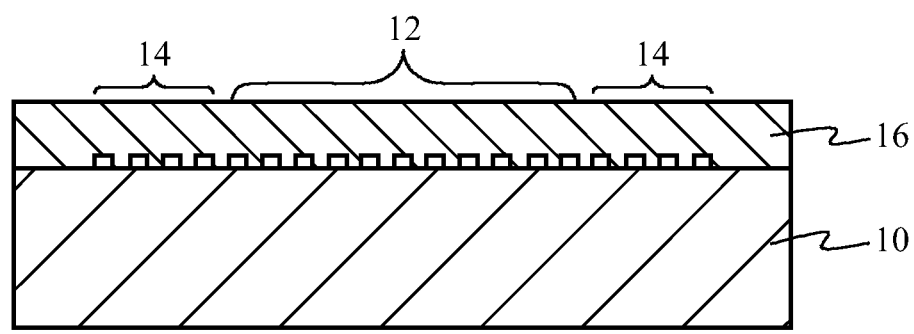
FIG. 1 is a cross-sectional view of a resonator.

A description will be first given of an experiment conducted by the inventors. FIG. 1 is a cross-sectional view of a resonator fabricated to measure a TCF. As illustrated in FIG. 1, a comb-shaped electrode 12 and reflectors 14 are formed on a piezoelectric substrate 10 made of a LN substrate. The reflectors 14 are located at both sides of the comb-shaped electrode 12. The comb-shaped electrode 12 and the reflectors 14 mainly include Cu. An undoped silicon oxide film 16 is formed on the piezoelectric substrate 10 so as to cover the comb-shaped electrode 12 and the reflectors 14. The undoped silicon oxide film 16 is formed by CVD (chemical vapor deposition), and has a film thickness of 0.3λ. λ is the wavelength of an acoustic wave, and corresponds to a pitch between electrode fingers of the comb-shaped electrode 12.

The undoped silicon oxide film 16 is formed by CVD under various film forming conditions. Changed are temperature, pressure, material gases, flow rate of the material gases, and high-frequency output, which is high frequency power to produce plasma, as the film forming conditions. The TCF of an anti-resonance frequency is measured with respect to resonators formed under the various film forming conditions. A silicon oxide film, which is formed under the film forming condition same as the undoped silicon oxide film 16, is measured by FTIR (Fourier transform infrared spectroscopy). The FTIR method is a measuring method that irradiates a material with infrared light, and then investigates the composition of the material based on absorption of the infrared light, which has energy corresponding to vibration energy of molecules. Here, the inventors focus on the absorption waveform of a Si—O stretching vibration in $SiO_2$.

Figure 2:
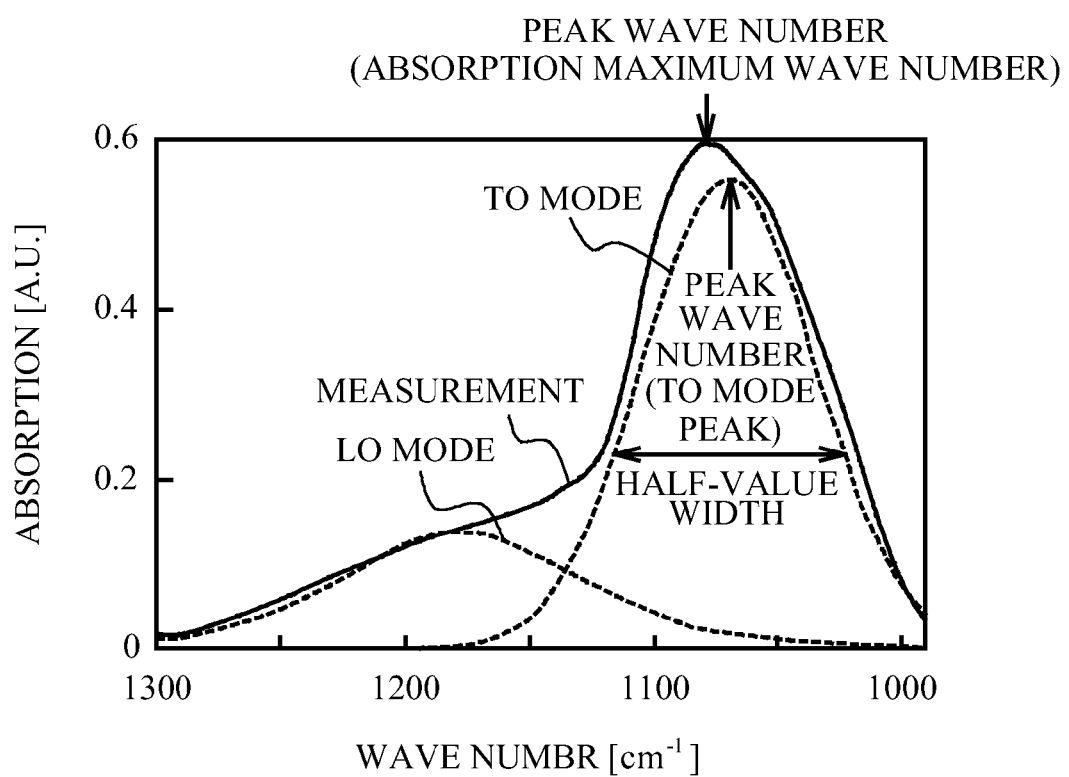
FIG. 2 is a diagram illustrating FTIR measurement results of a Si—O stretching vibration.

FIG. 2 is a diagram illustrating FTIR measurement results of the Si—O stretching vibration, and illustrates absorption in arbitrary coordinates versus wave numbers. A wave number at which the absorption reaches a maximum is measured, and the wave number at which the absorption reaches a maximum is indicated by "peak wave number (absorption maximum wave number)". The absorption of stretching vibration includes an optical transverse wave (TO) mode and an optical longitudinal wave (LO) mode. Thus, as illustrated in FIG. 2, the absorption of stretching vibration is separated into the TO mode and the LO mode, and a half-value width of the TO mode is measured. The peak wave number of the TO mode is indicated by "peak wave number (TO mode peak)".

Figure 3:
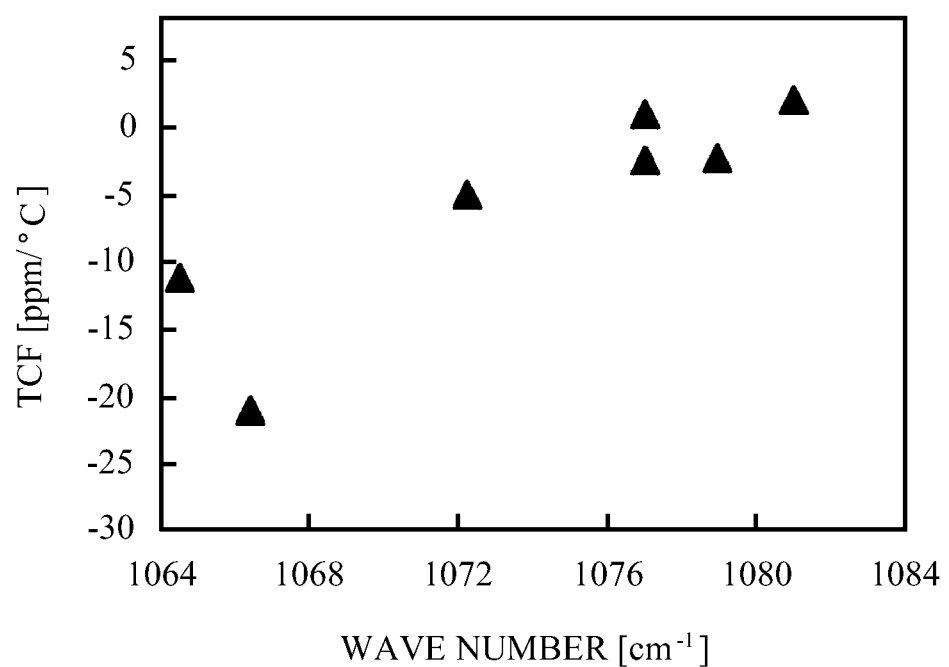
FIG. 3 is a graph of a TCF of an anti-resonance frequency of the resonator versus a peak wave number (absorption maximum wave number)

FIG. 3 is a graph of the TCF of the anti-resonance frequency of the resonator versus the peak wave number (absorption maximum wave number) measured by FTIR. Black triangles in FIG. 3 indicate measurement results under various film forming conditions. FIG. 3 reveals that the TCF of the anti-resonance frequency increases and comes closer to 0 as the peak wave number becomes larger, and the TCF is improved.

Figure 4:
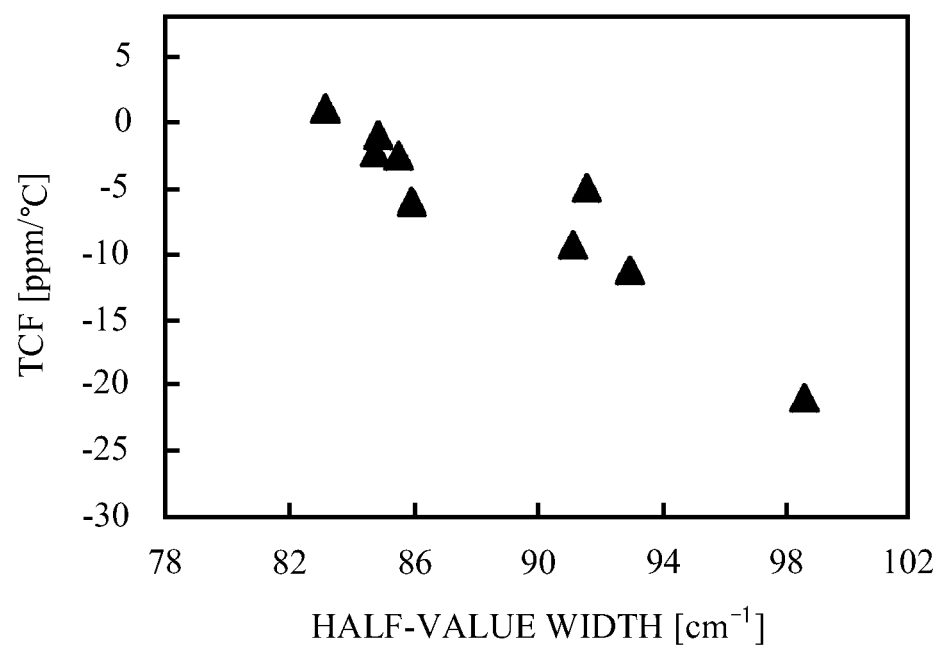
FIG. 4 is a graph of the TCF of the anti-resonance frequency of the resonator versus a half-value width of an optical transverse wave (TO) mode.

FIG. 4 is a graph of the TCF of the anti-resonance frequency of the resonator versus the half-value width of the optical transverse wave (TO) mode measured by FTIR. Black triangles in FIG. 4 indicate measurement results under various film forming conditions. FIG. 4 reveals that the TCF of the anti-resonance frequency increases and comes closer to 0 as the half-value width becomes smaller, and the TCF is improved.

Here, a description will be given of a supposable reason why the peak wave number affects the TCF. According to the Central-force network model (J. Vac. Sci. Technol. Vol. B5, pp 530-537 (1987)), the peak wave number of the Si—O stretching vibration has been known to depend on a Si—O bonding angle as expressed by a following equation.

$$K^2 = (f/mo) \cdot [\sin^2(\theta/2)] \quad \text{(equation 1)}$$

Here, k is a peak wave number, f is an atomic force between Si and O, mo is an atomic weight of oxygen, and θ is a Si—O—Si bonding angle.

In addition, based on the Lorentz-Lorenz relationship, a relationship among a permittivity, a density, and a molecular polarizability is expressed by a following equation.

$$(e-1)/(e+2) = 4\pi \cdot \mu \cdot C \quad \text{(equation 2)}$$

Here, e is a permittivity of a silicon oxide film, ρ is a density of the silicon oxide film, and C is a molecular polarizability.

The Si—O—Si bonding angle θ correlates with the permittivity, the density, and the molecular polarizability of the silicon oxide film. Therefore, the peak wave number is related to the permittivity, the density, and the molecular polarizability based on the equation 1 and the equation 2.

The TCF is expressed as follows using a velocity of the acoustic wave at room temperature (25° C.).

$$TCF = 1/v \cdot (\delta v/\delta T) - \alpha \quad \text{(equation 3)}$$

Here, v is a propagation velocity of the acoustic wave, (δv/δT) is a rate of change of the propagation velocity v to a temperature T, and α is a line thermal expansion coefficient.

According to "Temperature-compensated surface-acoustic-wave devices with $SiO_2$ film overlays" J. Appl. Phys. Vol. 50, No. 3, pp 1360-1369 (1979), (δv/δT) can be obtained from a temperature coefficient of material constant, i.e. a permittivity, a density, a Young's modulus, or the like, of the substrate (or the silicon oxide film). As described above, the material constant of the silicon oxide film, such as permittivity, density, or Young's modulus, is related to the TCF.

As described above, according to the equation 1 to the equation 3, the peak wave number of the Si—O stretching vibration is considered to affect the TCF.

FIG. 3 and FIG. 4 illustrate the TCF of the anti-resonance frequency of the resonator, but the results illustrated in FIG. 3 and FIG. 4 are applicable to the TCF of the resonance frequency of the resonator or the TCF of the frequency characteristic of a filter using the resonator. Also, the results illustrated in FIG. 3 and FIG. 4 are applicable to resonators in the FBAR device and the Lamb wave device, and acoustic wave filters using the resonators in addition to the surface acoustic wave device with the comb-shaped electrode formed on the piezoelectric substrate.

As illustrated in FIG. 3 and FIG. 4, the TCF of the anti-resonance frequency increases as the peak wave number becomes larger, and the TCF of the anti-resonance frequency increases as the half-value width becomes smaller, in the acoustic wave device using the silicon oxide film as the temperature compensation layer. For example, according to "Refractive index behavior of boron-doped silica films by plasma-enhanced chemical vapor deposition" Applied Surface Science 92 pp 387-390 (1996), the peak wave number of the B-doped silicon oxide film disclosed in Patent Document 1 tends to be small compared to that of the undoped silicon oxide film. Therefore, the result presented in FIG. 3 reveals that the TCF of the anti-resonance frequency is not improved sufficiently even though the B-doped silicon oxide film is used as the temperature compensation layer instead of the undoped silicon oxide film.

In addition, in the B-doped silicon oxide film, B does not enter the bonds in $SiO_2$, and exists as $B_2O_3$, i.e. impurities, in $SiO_2$. That is to say, B does not displace O in the Si—O bond, but displaces Si. According to "Ultrasonic Characterization of Silicate Glasses", IEICE technical report, US 98-50, an attenuation coefficient becomes large in a glass to which $B_2O_3$ is added. As described above, the B-doped silicon oxide film has an effect to increase the attenuation of the acoustic wave. For example, the acoustic wave propagates in a film thickness direction of the B-doped silicon oxide film in the FBAR device disclosed in Patent Document 1. The film thickness of the B-doped silicon oxide film is thin. Therefore, the distance of the B-doped silicon oxide film through which the acoustic wave propagates is short, and the attenuation of the acoustic wave is small. On the other hand, the acoustic wave propagates in a direction perpendicular to the film thickness direction of the B-doped silicon oxide film in the acoustic wave device in which the silicon oxide film is formed so as to cover the comb-shaped electrode as illustrated in FIG. 1. This increases the distance of the B-doped silicon oxide film through which the acoustic wave propagates, and thus causes the attenuation of the acoustic wave to become large.

Hereinafter, a description will be given of embodiments of an acoustic wave device capable of improving a temperature dependence of frequency.

First Embodiment

Figure 5A:
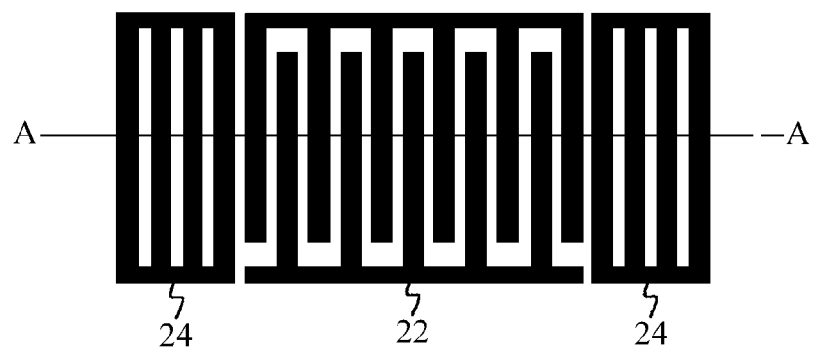
FIG. 5A is a top view of an acoustic wave device in accordance with a first embodiment.
Figure 5B:
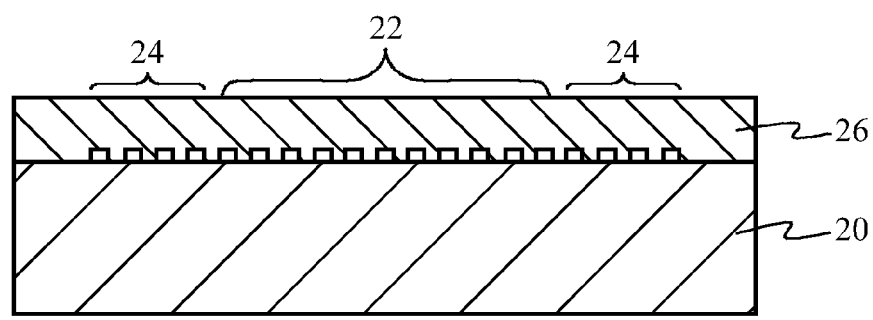
FIG. 5B is a cross-sectional view taken along line A-A in FIG. 5A.

An acoustic wave device of a first embodiment is an exemplary resonator in an acoustic wave device with a comb-shaped electrode located on a piezoelectric substrate, and can be used in surface acoustic wave devices, Love wave devices, and boundary acoustic wave devices for example. FIG. 5A is a top view of the acoustic wave device in accordance with the first embodiment, and FIG. 5B is a cross-sectional view taken along line A-A in FIG. 5A. As illustrated in FIG. 5A, reflectors 24 are located at both sides of a comb-shaped electrode 22. The comb-shaped electrode 22 is an electrode that excites the acoustic wave, and in which two electrodes for input and output face each other so that respective electrode fingers are arranged alternately. The comb-shaped electrode 22 and the reflectors 24 mainly include Cu. As illustrated in FIG. 5B, the comb-shaped electrode 22 and the reflectors 24 are formed on a piezoelectric substrate 20 made of a 0-degree rotation Y-cut LN substrate. An F (fluorine)-doped silicon oxide film (e.g. SiOF film) 26 is formed on the piezoelectric substrate 20 so as to cover the comb-shaped electrode 22 and the reflectors 24. The F-doped silicon oxide film 26 can be formed by CVD using $SiH_4$, $N_2O$, and $C_2F_6$ for material gases, and an F content can be adjusted using the flow rate ratio of the material gases. The F-doped silicon oxide film 26 preferably has a film thickness thicker than that of the comb-shaped electrode 22 to improve the TCF of the anti-resonance frequency and the like. For example, the film thickness of the F-doped silicon oxide film 26 between the electrode fingers is preferably thicker than that of the comb-shaped electrode 22. The first embodiment sets the film thickness of the F-doped silicon oxide film 26 to $0.3\lambda$. $\lambda$ is the wavelength of the acoustic wave, and corresponds to a pitch between electrode fingers of the comb-shaped electrode 22.

Figure 6:
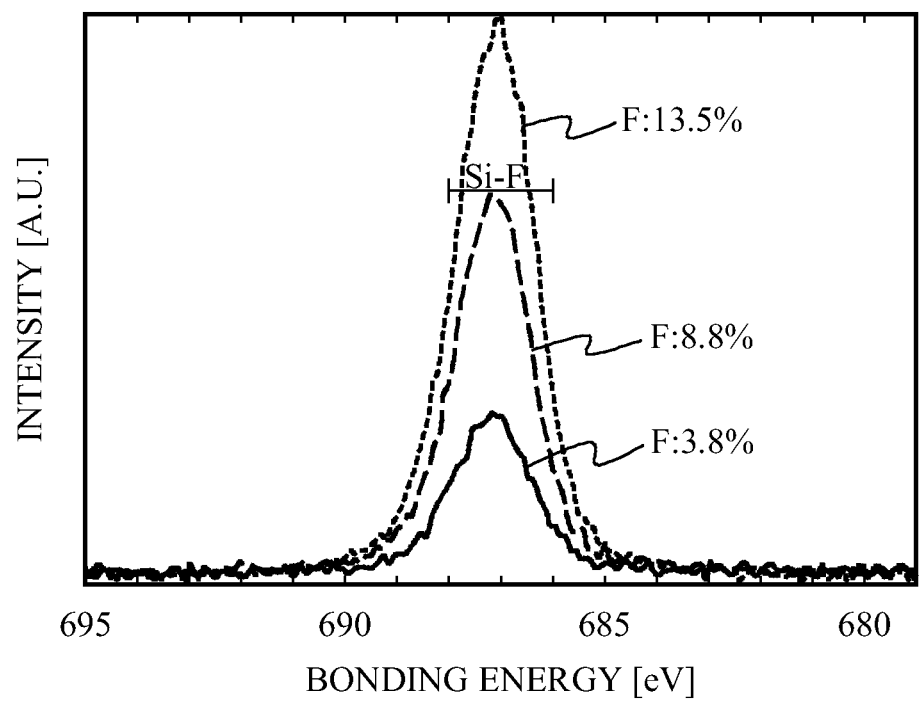
FIG. 6 is a diagram illustrating XPS measurement results.

The XPS (X-ray photoemission spectroscopy) measurement is conducted on the F-doped silicon oxide film to examine how F is incorporated into the silicon oxide film when the silicon oxide film is doped with F. The XPS measurement is conducted on three silicon oxide films with respective F contents of 3.8%, 8.8%, and 13.5%. FIG. 6 is a diagram illustrating the XPS measurement results, and illustrates intensity in arbitrary coordinates versus bonding energy. The XPS measurement results in FIG. 6 indicate that F displaces 0 in the Si—O bond and forms a Si—F bond when the silicon oxide film is doped with F, and that the Si—F bond increases as the F content increases.

Next, three resonators, the respective F-doped silicon oxide films 26 of which have F contents of 2.1%, 3.8%, and 8.8%, are fabricated with respect to the resonator of the first embodiment. For example, the F-doped silicon oxide film 26 with an F content of 8.8% is formed by setting the flow rate ratio of $SiH_4$, $N_2O$, and $C_2F_6$ to $SiH_4:N_2O:C_2F_6=1:50:3$, and the film formation temperature to 270° C. A resonator is fabricated as the comparative example by using the production condition same as that of the resonator of the first embodiment except that $C_2F_6$ gas, which is a source of F, is not used. That is to say, the silicon oxide film covering the comb-shaped electrode is formed to be the undoped silicon oxide film with a film thickness of $0.3\lambda$ by CVD using $SiH_4$ and $N_2O$ for material gases, and setting the flow rate ratio to $SiH_4:N_2O=1:50$, and the film formation temperature to 270° C. in the resonator of the comparative example.

Figure 7:
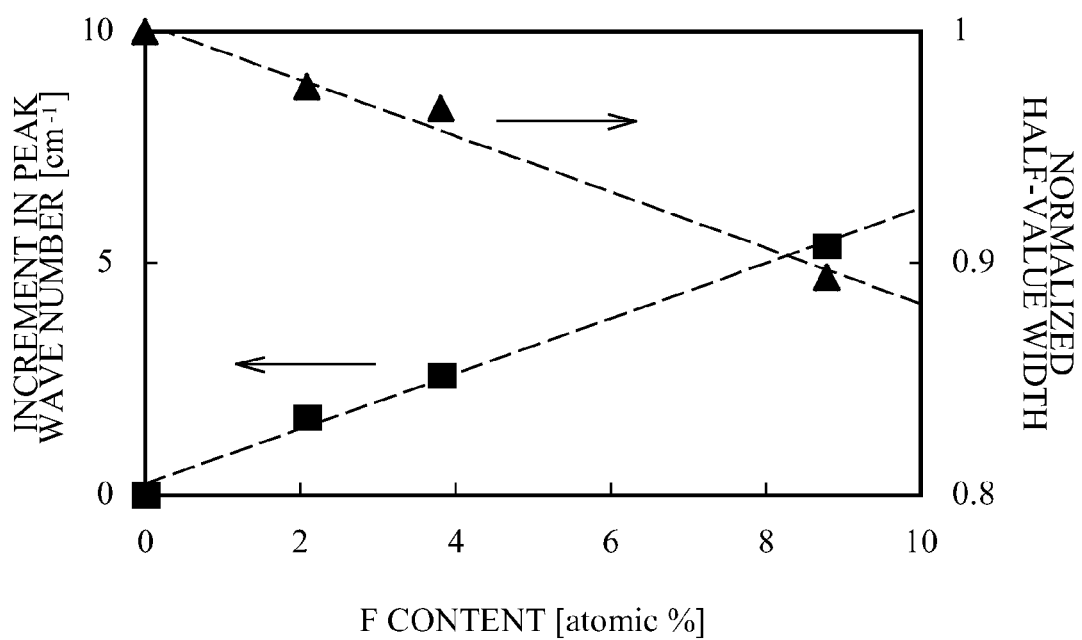
FIG. 7 is a graph of an increment in peak wave number (absorption maximum wave number) and the half-value width of the optical transverse wave (TO) mode normalized by that of an undoped silicon oxide film versus an F content.

First, measured by FTIR are peak wave numbers (absorption maximum wave number) of the Si—O bond stretching vibration and half-value widths of the optical transverse wave (TO) mode with respect to the silicon oxide films formed under the same film forming conditions as those of the three F-doped silicon oxide films 26 with respective F contents of 2.1%, 3.8%, and 8.8%, and the undoped silicon oxide film with an F content of 0%. FIG. 7 is a graph of an increment in peak wave number (absorption maximum wave number) and a half-value width of the optical transverse wave (TO) mode normalized by the half-value width of the optical transverse wave (TO) mode of the undoped silicon oxide film versus an F content. In FIG. 7, black rectangles indicate measurement results of the peak wave number, black triangles indicate measurement results of the half-value width, and approximated lines of them are presented. As illustrated in FIG. 7, the peak wave number increases and the half-value width decreases as the F content increases.

Figure 8:
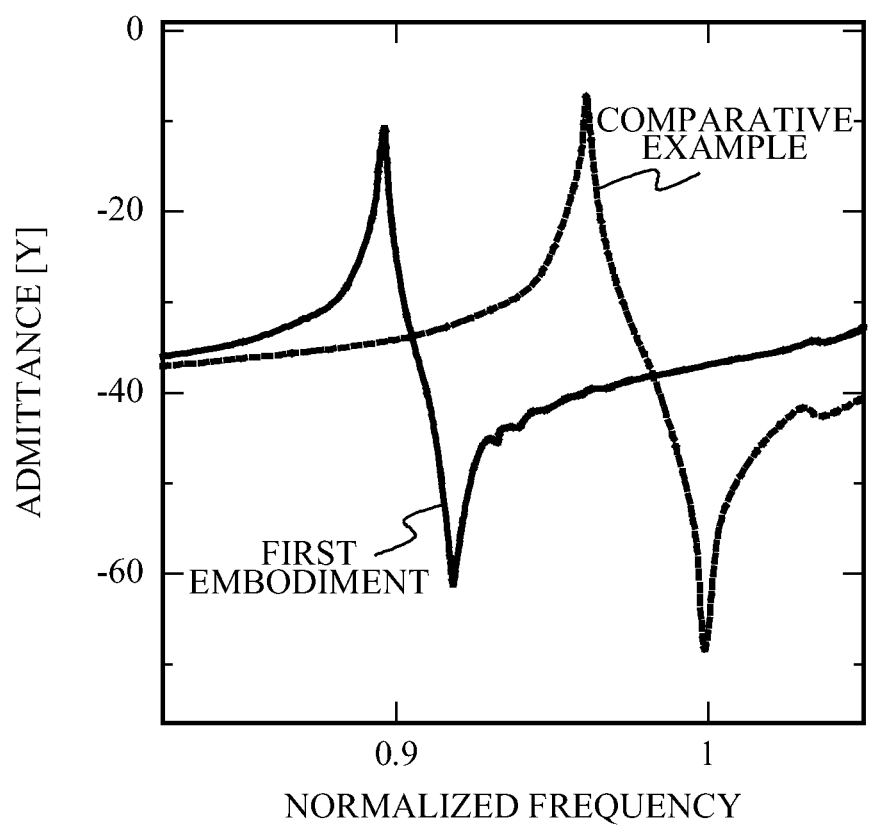
FIG. 8 is a diagram illustrating measurement results of frequency characteristics of resonators in accordance with the first embodiment and a comparative example.

Next, frequency characteristics are measured with respect to the resonator using the F-doped silicon oxide film 26 with an F content of 8.8%, which is one of the three resonators of different F contents of the first embodiment, and the resonator using the undoped silicon oxide film of the comparative example. FIG. 8 is a diagram illustrating measurement results of frequency characteristics of the resonators of the first embodiment and the comparative example, and illustrates admittance versus frequency normalized by the anti-resonance frequency of the resonator of the comparative example. As illustrated in FIG. 8, the anti-resonance frequency of the resonator of the first embodiment, which uses the F-doped silicon oxide film 26 with an F content of 8.8%, results in 0.92 multiple of that of the resonator of the comparative example, and the electromechanical coupling coefficient $K^2$ results in 0.76 multiple. This indicates that the F-doped silicon oxide film 26 has a small Young's modulus and a slow acoustic velocity compared to the undoped silicon oxide film. That is to say, it is considered that the distribution of acoustic waves therein differs from that in the undoped silicon oxide film significantly and the $K^2$ changes drastically in the same film thickness because the F-doped silicon oxide film 26 has a slower acoustic velocity.

Figure 9:
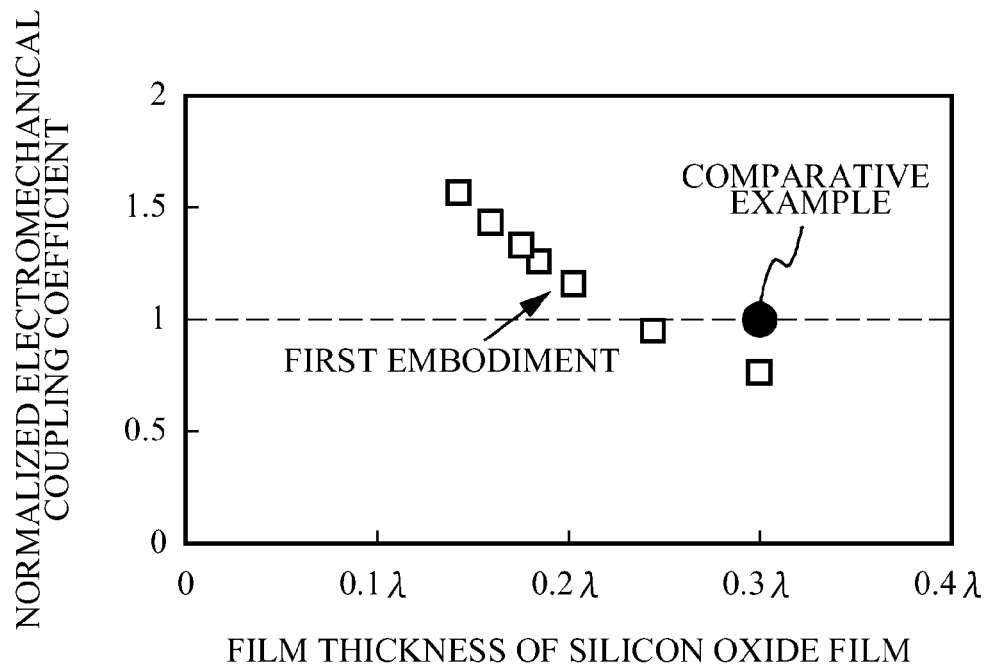
FIG. 9 is a diagram illustrating measurement results of $K^2$ at various film thicknesses of an F-doped silicon oxide film.

The behavior of the $K^2$ is investigated by changing the film thickness of the F-doped silicon oxide film 26 in order to make the $K^2$ of the resonator of the first embodiment, which uses the F-doped silicon oxide film 26 with an F content of 8.8%, approximately equal to the $K^2$ of the resonator of the comparative example. FIG. 9 is a diagram illustrating measurement results of the $K^2$ at various film thicknesses of the F-doped silicon oxide film 26, and illustrates the $K^2$ normalized by the $K^2$ of the resonator of the comparative example versus the film thickness of the silicon oxide film. In FIG. 9, a black circle indicates the $K^2$ of the resonator of the comparative example, and white squares indicate the $K^2$ at various film thicknesses of the F-doped silicon oxide film 26. As illustrated in FIG. 9, the $K^2$ increases as the film thickness of the F-doped silicon oxide film 26 becomes thinner. This suggests that the resonator of the first embodiment can obtain the $K^2$ approximately equal to that of the resonator of the comparative example, which uses the undoped silicon oxide film with a film thickness equal to the unreduced film thickness of the F-doped silicon oxide film 26, by reducing the film thickness of the F-doped silicon oxide film 26.

Figure 10:
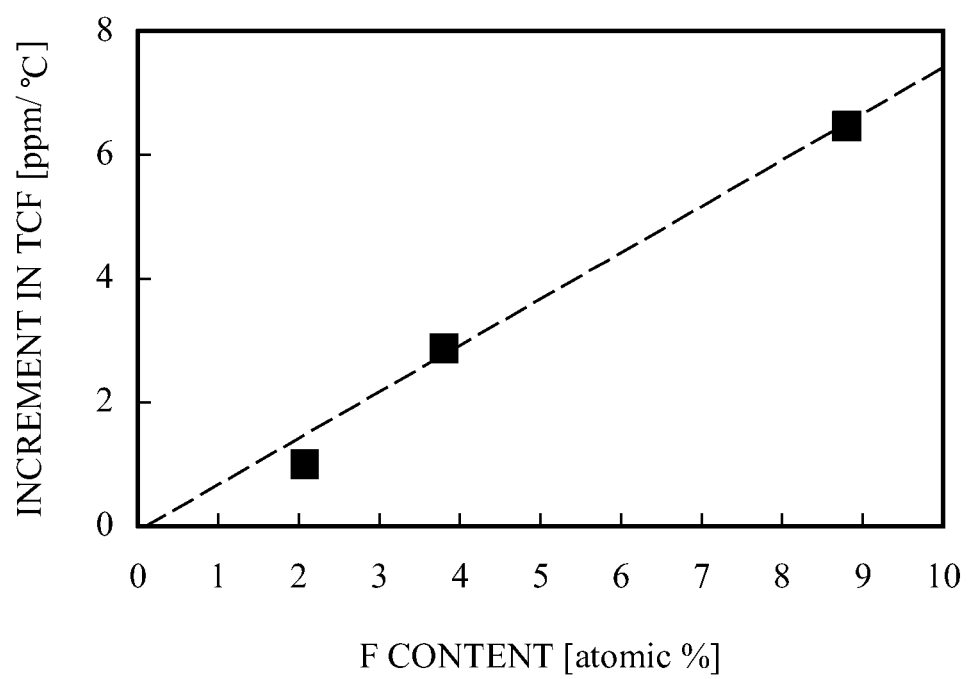
FIG. 10 is a graph of an increment in TCF versus an F content of the F-doped silicon oxide film.

Thus, the film thicknesses of the F-doped silicon oxide films 26 are adjusted so that the three above-described resonators with respective F contents of 2.1%, 3.8%, and 8.8% can obtain the $K^2$ approximately equal to that of the resonator of the comparative example, and then the TCF of the anti-resonance frequency is measured with respect to the three resonators. FIG. 10 is a graph of an increment in TCF versus an F content of the F-doped silicon oxide film 26. As illustrated in FIG. 10, the TCF increases as the F content increases. When the F content is 2.1%, the TCF increases by 1 ppm/° C., when the F content is 3.8%, the TCF increases by 2.9 ppm/° C., and when the F content is 8.8%, the TCF increases by 6.5 ppm/° C. This is assumed to be due to the increase in the peak wave number and the decrease in the half-value width with increase in the F content caused by doping the silicon oxide film with F as illustrated in FIG. 7.

As explained above, the first embodiment forms the comb-shaped electrode 22 and the reflectors 24, which excite the acoustic wave, on the piezoelectric substrate 20 (piezoelectric substance), and forms the F-doped silicon oxide film 26 on the piezoelectric substrate 20 so as to cover the comb-shaped electrode 22 and the reflectors 24. When the silicon oxide film is doped with F, as described in FIG. 6, F displaces O in the Si—O bond, and forms the Si—F bond. That is to say, F displaces O in a siloxane (Si—O—Si) network or in a Si—O covalent bond, and is incorporated into the bond in SiO$_2$ as a terminated group Si—F. As described in FIG. 7, the peak wave number (absorption maximum wave number) of the Si—O bond stretching vibration can be made to be large, and the half-value width of the optical transverse wave (TO) mode of the Si—O bond stretching vibration can be made to be small by forming the F-doped silicon oxide film 26, which is doped with F displacing O in the Si—O bond, so as to cover the comb-shaped electrode 22, compared to forming the undoped silicon oxide film. As described in FIG. 3 and FIG. 4, the TCF increases as the peak wave number (absorption maximum wave number) becomes larger and the half-value width of the optical transverse wave (TO) mode becomes smaller. Therefore, the first embodiment can increase the TCF by using the F-doped silicon oxide film 26 as described in FIG. 10, and thus can improve the TCF.

Since F with which the silicon oxide film is doped is incorporated into the bond in SiO$_2$ as a terminated group Si—F, it does not exist in SiO$_2$ as impurities. Thus, the F-doped silicon oxide film 26 has a small effect in attenuating the acoustic wave, and therefore, the acoustic wave is little attenuated even though the F-doped silicon oxide film 26 is provided so as to cover the comb-shaped electrode 22. Therefore, the first embodiment can suppress the attenuation of the acoustic wave.

The first embodiment uses the F-doped silicon oxide film 26 for the silicon oxide film formed so as to cover the comb-shaped electrode 22, but does not intend any limitation. A silicon oxide film doped with an element or molecule that displaces O in the Si—O bond may be used. The silicon oxide film may be doped with a single kind of element or molecule, or may be doped with two or more kinds of element or molecule.

The silicon oxide film doped with an element or molecule is preferably doped with an element or molecule that makes the peak wave number (absorption maximum wave number) of the Si—O bond stretching vibration larger than that of the silicon oxide film not doped with the element or molecule because the TCF increases as the peak wave number (absorption maximum wave number) of the Si—O bond stretching vibration becomes larger as described in FIG. 3. In addition, the silicon oxide film doped with an element or molecule is preferably doped with an element or molecule that makes the half-value width of the optical transverse wave (TO) mode of the Si—O bond stretching vibration smaller than that of the silicon oxide film not doped with the element or molecule because the TCF increases as the half-value width of the optical transverse wave (TO) mode of the Si—O bond stretching vibration becomes smaller as described in FIG. 4. Actually, when the F content is 13.5%, the peak wave number (absorption maximum wave number) of the Si—O bond stretching vibration is smaller than that of the silicon oxide film not doped with the element or molecule, and the half-value width of the optical transverse wave (TO) mode of the Si—O bond stretching vibration is larger than that of the silicon oxide film not doped with the element or molecule, and the TCF of the SiOF film with 13.5% is smaller than that of the silicon oxide film not doped with the element or molecule.

H, CH$_3$, CH$_2$, F, Cl, C, N, P, and S are examples of the element or molecule that makes the peak wave number of the Si—O bond stretching vibration large, and the half-value width of the TO mode small. Therefore, the silicon oxide film doped with an element of molecule is preferably doped with any one of H, CH$_3$, CH$_2$, F, Cl, C, N, P, and S (collectively referred to as "R") to displace O, and is preferably a silicon oxide film having a Si—R covalent bond. In addition, it preferably has a terminated group of Si—H, Si—CH$_3$, Si—F, Si—Cl, Si—C, Si—N, Si—P, or Si—S. For example, a Si—H based material is referred to as HSQ (Hydrogen Silsesquioxane), a Si—CH$_3$ based material is referred to as SiOC, SiOCH, or OSG (Organo Silica Glass), a Si—F based material is referred to as SiOF or FSG (Fluorinated Silica Glass), and a Si—Cl based material is referred to as Chlorinated Silica.

The increase in TCF and the decrease in K$^2$ in the silicon oxide film doped with an element or molecule means the increase in energy confinement volume of the acoustic wave in the silicon oxide film. This is due to the slow acoustic velocity in the silicon oxide film doped with the element or molecule. Therefore, the silicon oxide film doped with an element or molecule preferably has a slow acoustic velocity to increase the TCF, and, for example, preferably has an acoustic velocity slower than that in the undoped silicon oxide film. In addition, in the above presented equation 3, the propagation velocity v can be expressed by v=(E/ρ)$^{1/2}$. Here, E is a Young's modulus, and ρ is a density. This indicates that the TCF becomes larger as the Young's modulus E becomes smaller. Therefore, the silicon oxide film doped with an element or molecule preferably has a small Young's modulus E, and for example, preferably has a Young's modulus E smaller than that of the undoped silicon oxide film.

As described in FIG. 8, the K$^2$ of the resonator using the F-doped silicon oxide film 26 is smaller than the K$^2$ of the resonator using the undoped silicon oxide film having a film thickness equal to that of the F-doped silicon oxide film 26 (film thickness: 0.3λ). As different K$^2$s bring concern that the specification is not satisfied, the resonator using the F-doped silicon oxide film 26 preferably has a K$^2$ approximately equal to the K$^2$ of the resonator using the undoped silicon oxide film. As described in FIG. 9, the K$^2$ increases as the film thickness of the F-doped silicon oxide film 26 is thinned. Therefore, the F-doped silicon oxide film 26 preferably has a film thickness thinner than the film thickness 0.3λ of the undoped silicon oxide film to recover the decreasing K$^2$. That is to say, the silicon oxide film doped with an element or molecule preferably has a film thickness thinner than that of the undoped silicon oxide film having a given film thickness to recover the K$^2$, which becomes smaller than that of the undoped silicon oxide film with the given film thickness, by doping the undoped silicon oxide film having the given film thickness with the element or molecule.

The first embodiment uses SiH$_4$, N$_2$O, and C$_2$F$_6$ for the material gases in forming the F-doped silicon oxide film 26, but does not intend any limitation. For example, tetraethoxysilane (TEOS), or SiF$_4$ may be used as a source of Si besides SiH$_4$. CF$_4$, NF$_3$, F$_2$, HF, SF$_6$, ClF$_3$, BF$_3$, BrF$_3$, SF$_4$, SiF$_4$, NF$_2$Cl, FSiH$_2$, or F$_3$SiH may be used as a source of F besides C$_2$F$_6$.

In addition, the piezoelectric substrate 20 may be made of LT, ZnO, KNbO$_3$, or LBO besides LN. The comb-shaped electrode 22 and the reflectors 24 may be made of a metal material mainly including Al, Au, Ag, W, Ta, Pt, Mo, Ni, Co, Cr, Fe, Mn, or Ti besides Cu. In particular, when the F-doped silicon oxide film 26 is used, F may react with water, and produce HF. Accordingly, the electrode is preferably made of a metal material, such as Cu, Au, Ag, W, Pt, Mo, Ni, or Cr, which does not react with HF. A heat treatment such as an annealing treatment is preferably performed on the silicon oxide film doped with an element or molecule because it improves the filter characteristics.

The first embodiment measures the peak wave number of the Si—O bond stretching vibration and the half-value width of the optical transverse wave (TO) mode of the Si—O bond stretching vibration by FTIR, but the Raman spectroscopy may be used besides FTIR.

Second Embodiment

Figure 11:
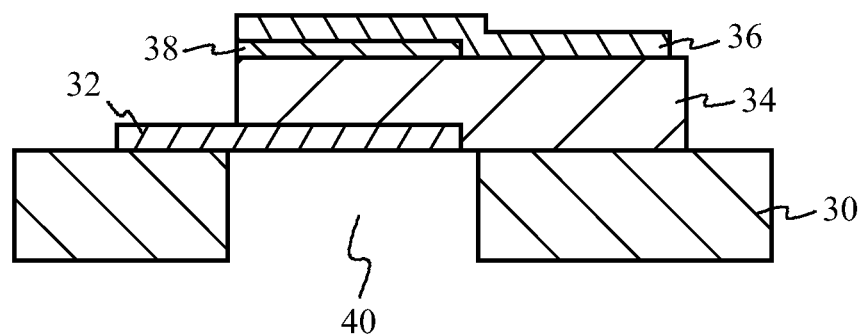
FIG. 11 is a cross-sectional view of an acoustic wave device in accordance with a second embodiment.

An acoustic wave device in accordance with a second embodiment is an exemplary resonator in an FBAR device. FIG. 11 is a cross-sectional view of the acoustic wave device of the second embodiment. As illustrated in FIG. 11, a lower electrode 32 made of, for example, Cu is located on a substrate 30 made of Si (silicon) for example. A piezoelectric film 34 made of, for example, AlN (aluminum nitride) is located on the lower electrode 32. An upper electrode 36 made of, for example, Cu is located on the piezoelectric film 34 so as to have a portion (resonance portion) that faces the lower electrode 32 across the piezoelectric film 34. An F-doped silicon oxide film 38 is located between the piezoelectric film 34 and the upper electrode 36 and in a region in which the lower electrode 32 and the upper electrode 36 face each other. A space 40 is located in the substrate 30 in the region in which the lower electrode 32 and the upper electrode 36 face each other.

In the FBAR device, the TCF increases as the peak wave number becomes larger, and the TCF increases as the half-value width becomes smaller as described in FIG. 3 and FIG. 4 of the first embodiment. As explained in FIG. 7 of the first embodiment, the peak wave number increases and the half-value width decreases by forming the F-doped silicon oxide film 38 in the region in which the lower electrode 32 and the upper electrode 36, which excite the acoustic wave, are located across the piezoelectric film 34 (piezoelectric substance) as illustrated in FIG. 11. Therefore, the second embodiment can increase the TCF, and thus improve the TCF.

Figure 12A:
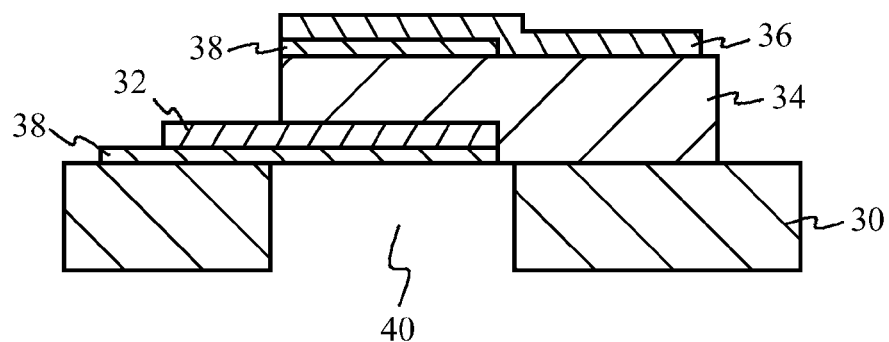
FIG. 12A through FIG. 12C are cross-sectional views of acoustic wave devices in accordance with first through third variations of the second embodiment.
Figure 12B:
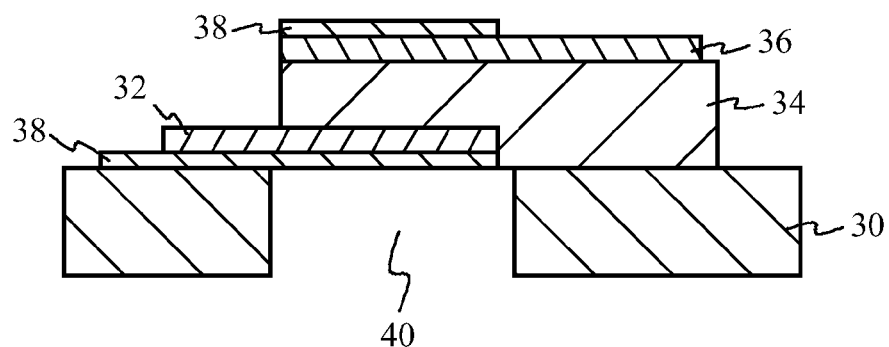
Figure 12C:
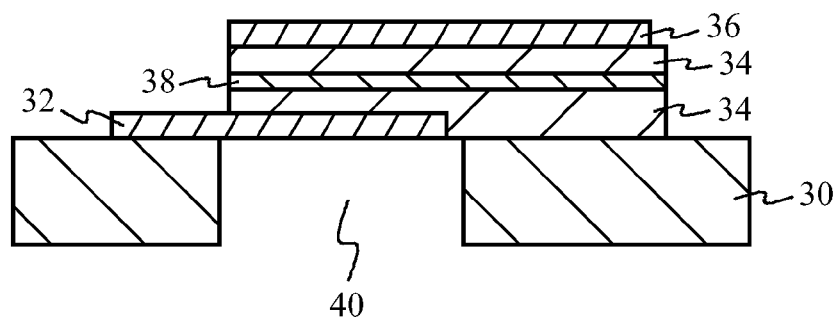

FIG. 12A through FIG. 12C are cross-sectional views of acoustic wave devices in accordance with first through third variations of the second embodiment. As illustrated in FIG. 12A, the F-doped silicon oxide films 38 are located between the substrate 30 and the lower electrode 32 and between the piezoelectric film 34 and the upper electrode 36, and in the region in which the lower electrode 32 and the upper electrode 36 face each other in the acoustic wave device of the first variation of the second embodiment. As illustrated in FIG. 12B, the F-doped silicon oxide films 38 are located between the substrate 30 and the lower electrode 32 and on the upper electrode 36, and in the region in which the lower electrode 32 and the upper electrode 36 face each other in the acoustic wave device of the second variation of the second embodiment. As illustrated in FIG. 12C, the F-doped silicon oxide film 38 is sandwiched by the piezoelectric films 34 and located in the region in which the lower electrode 32 and the upper electrode 36 face each other in the acoustic wave device of the third variation of the second embodiment.

The acoustic wave devices of the first through third variations of the second embodiment can also increase the TCF, and thus improve the TCF because the F-doped silicon oxide film 38 is located in the region where the lower electrode 32 and the upper electrode 36 face each other.

The second embodiment may use a silicon oxide film doped with an element or molecule that displaces O in the Si—O bond besides the F-doped silicon oxide film 38. The second embodiment may use ZnO, PZT, or $PbTiO_2$ for the piezoelectric film 34 besides AN. The substrate 30 may be made of a glass or GaAs besides Si. The lower electrode 32 and the upper electrode 36 may be made of a metal material such as Al, Au, Ag, Mo, W, Ta, Pt, Ru, Rh, Ir, Ni, Cr, or Ti besides Cu. In particular, as described in the first embodiment, when the F-doped silicon oxide film 38 is used, the lower electrode 32 and the upper electrode 36 are preferably made of a metal material, such as Cu, Au, Ag, W, Pt, Mo, Ni, or Cr, which does not react with HF.

The second embodiment forms the space 40 by removing the substrate 30 in the region where the lower electrode 32 and the upper electrode 36 face each other, but does not intend any limitation. For example, the space 40 may be formed by providing a concave portion to the substrate 30, or the space 40 may be formed above the substrate 30 and between the substrate 30 and the lower electrode 32. In addition, an acoustic multilayered film, which is formed by alternately stacking a film having a high acoustic impedance and a film having a low acoustic impedance with a film thickness of $\lambda/4$, may be formed instead of the space 40.

The second embodiment describes the exemplary FBAR device, but may be adopted to a Lamb wave device in which a lower electrode, a piezoelectric film, and an upper comb-shaped electrode are stacked. The Lamb wave device can increase the TCF, and thus improve the TCF by providing a silicon oxide film doped with an element or molecule displacing O in the Si—O bond in a region where the lower electrode and the upper comb-shaped electrode face each other.

The first embodiment and the second embodiment are the exemplary resonators, but may be a ladder-type filter or a multimode type filter using these resonators.

Although the embodiments of the present invention have been described in detail, it should be understood that the present invention is not limited to these specifically described embodiments, and the various change, substitutions, and alterations could be made hereto without departing from the spirit and scope of the invention.

What is claimed is:

1. An acoustic wave device comprising:
    an electrode that excites an acoustic wave and is located on a substrate; and
    a silicon oxide film that is located so as to cover the electrode and is doped with an element or molecule displacing O in a Si—O bond, wherein
    the element or molecule is F, H, $CH_3$, $CH_2$, Cl, C, N, P, or S, and
    the silicon oxide film doped with the element or molecule has a peak wave number of a Si—O bond stretching vibration larger than that of a silicon oxide film that is not doped with the element or molecule.

2. The acoustic wave device according to claim 1, wherein the element or molecule is F, H, $CH_3$, $CH_2$, or Cl.

3. The acoustic wave device according to claim 2, wherein the electrode is a comb-shaped electrode located on a piezoelectric substance.

4. The acoustic wave device according to claim 1, wherein
    the electrode includes a lower electrode and an upper electrode that are located so as to sandwich a piezoelectric substance, and
    the silicon oxide film doped with the element or molecule is located in a region in which the lower electrode and the upper electrode face each other.

5. The acoustic wave device according to claim 1, wherein the silicon oxide film doped with the element or molecule has a half-value width of an optical transverse wave mode of a Si—O bond stretching vibration smaller than that of a silicon oxide film that is not doped with the element or molecule.

6. The acoustic wave device according to claim 1, wherein the silicon oxide film doped with the element or molecule has a Young's modulus smaller than that of an undoped silicon oxide film.

7. The acoustic wave device according to claim 1, wherein the silicon oxide film doped with the element or molecule has an acoustic velocity slower than that of an undoped silicon oxide film.

8. The acoustic wave device according to claim 1, wherein the silicon oxide film is doped with two or more kinds of element of molecule.

9. The acoustic wave device according to claim 1, wherein the element or molecule is F.

10. The acoustic wave device according to claim 1, wherein the electrode is made of Cu, Au, Ag, W, Pt, Mo, Ni, or Cr.

11. The acoustic wave device according to claim 1, wherein the silicon oxide film doped with the element or molecule is formed by CVD.

12. The acoustic wave device according to claim 9, wherein $C_2F_6$, $CF_4$, $NF_3$, $F_2$, HF, $SF_6$, $ClF_3$, $BF_3$, $BrF_3$, $SF_4$, $SiF_4$, $NF_2Cl$, $FSiH_2$, or $F_3SiH$ is used as a source of the F.

13. The acoustic wave device according to claim 9, wherein the F content is not less than 2.1 atomic % and not more than 8.8 atomic %.

\* \* \* \* \*